(12) United States Patent
Liu et al.

(10) Patent No.: US 11,710,931 B2
(45) Date of Patent: Jul. 25, 2023

(54) BACKPLANE CONNECTOR WITH IMPROVED STRUCTURE STRENGTH

(71) Applicant: DONGGUAN LUXSHARE TECHNOLOGIES CO., LTD, Dongguan (CN)

(72) Inventors: Xiaogang Liu, Dongguan (CN); Kun Liu, Dongguan (CN); Rongzhe Guo, Dongguan (CN); Chuanqi Gong, Dongguan (CN); Tao Song, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 191 days.

(21) Appl. No.: 17/341,083

(22) Filed: Jun. 7, 2021

(65) Prior Publication Data

US 2021/0399489 A1    Dec. 23, 2021

(30) Foreign Application Priority Data

Jun. 19, 2020  (CN) .......................... 202010567796.4
Aug. 17, 2020  (CN) .......................... 202010822431.1

(51) Int. Cl.
*H01R 13/6471* (2011.01)
*H01R 13/40* (2006.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC ............. H01R 13/6471; H01R 12/585; H01R 12/716; H01R 12/724; H01R 13/02;
(Continued)

(56) References Cited

U.S. PATENT DOCUMENTS

| 4,601,527 A | 7/1986 | Lemke |
|---|---|---|
| 5,664,968 A | 9/1997 | Mickievicz |

(Continued)

FOREIGN PATENT DOCUMENTS

| CN | 1244959 A | 2/2000 |
|---|---|---|
| CN | 2513252 Y | 9/2002 |

(Continued)

OTHER PUBLICATIONS

Chinese Office Action and Search Report for Chinese Application No. 202011577310.1, dated Nov. 23, 2021, is attached.

(Continued)

*Primary Examiner* — Abdullah A Riyami
*Assistant Examiner* — Justin M Kratt
(74) *Attorney, Agent, or Firm* — Birch, Stewart, Kolasch & Birch, LLP

(57) ABSTRACT

A backplane connector includes a housing and a number of terminal modules assembled to the housing. The housing includes a base, a first side wall and a second side wall. The base, the first side wall and the second side wall jointly form a receiving space. The terminal module includes a first signal terminal and a second signal terminal. The housing includes a number of insulating protrusions integrally extending from the base. The insulating protrusions extend into the receiving space. The terminal modules are assembled in the insulating protrusions. Compared with the prior art, the insulating protrusions of the present disclosure is integrally formed with the base, thereby improving the structural strength of the housing and improving the durability of the backplane connector.

20 Claims, 17 Drawing Sheets

(51) Int. Cl.

| | |
|---|---|
| *H01R 13/6587* | (2011.01) |
| *H01R 13/6591* | (2011.01) |
| *H01R 13/514* | (2006.01) |
| *H01R 13/518* | (2006.01) |
| *H01R 12/72* | (2011.01) |
| *H01R 13/6586* | (2011.01) |
| *H01R 12/58* | (2011.01) |
| *H05K 1/11* | (2006.01) |
| *H01R 13/6588* | (2011.01) |
| *H01R 13/6583* | (2011.01) |
| *H01R 13/6585* | (2011.01) |
| *H01R 13/6582* | (2011.01) |
| *H01R 43/24* | (2006.01) |
| *H01R 12/71* | (2011.01) |
| *H01R 13/20* | (2006.01) |
| *H01R 13/504* | (2006.01) |
| *H01R 13/6461* | (2011.01) |
| *H01R 13/6584* | (2011.01) |
| *H05K 3/30* | (2006.01) |
| *H01R 13/02* | (2006.01) |
| *H05K 3/34* | (2006.01) |
| *H01R 13/6474* | (2011.01) |
| *H01R 13/502* | (2006.01) |
| *H01R 13/46* | (2006.01) |
| *H01R 13/646* | (2011.01) |
| *H01R 13/6473* | (2011.01) |
| *H01R 13/6581* | (2011.01) |

(52) U.S. Cl.
CPC ........... *H01R 12/724* (2013.01); *H01R 13/02* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H05K 3/306* (2013.01); *H05K 3/3447* (2013.01); *H01R 12/71* (2013.01); *H01R 12/712* (2013.01); *H01R 12/722* (2013.01); *H01R 13/46* (2013.01); *H01R 13/502* (2013.01); *H01R 13/646* (2013.01); *H01R 13/6473* (2013.01); *H01R 13/6474* (2013.01); *H01R 13/6581* (2013.01); *H05K 2201/09236* (2013.01); *H05K 2201/1078* (2013.01); *H05K 2201/10189* (2013.01); *H05K 2201/10371* (2013.01); *H05K 2201/10871* (2013.01)

(58) Field of Classification Search
CPC ...... H01R 13/20; H01R 13/40; H01R 13/504; H01R 13/514; H01R 13/518; H01R 13/6461; H01R 13/6582; H01R 13/6583; H01R 13/6584; H01R 13/6585; H01R 13/6586; H01R 13/6587; H01R 13/6588; H01R 13/6591; H01R 43/24; H01R 12/71; H01R 12/712; H01R 12/722; H01R 13/46; H01R 13/502; H01R 13/646; H01R 13/6473; H01R 13/6474; H01R 13/6581; H05K 1/115; H05K 3/306; H05K 3/3447; H05K 2201/09236; H05K 2201/10189; H05K 2201/10371; H05K 2201/1078; H05K 2201/10871
See application file for complete search history.

(56) References Cited

U.S. PATENT DOCUMENTS

| | | | |
|---|---|---|---|
| 9,350,126 B2 | 5/2016 | Little et al. | |
| 9,548,570 B2 | 1/2017 | Laurx et al. | |
| 2004/0043658 A1 | 3/2004 | Ko | |
| 2004/0229510 A1 | 11/2004 | Lloyd et al. | |
| 2007/0155239 A1 | 7/2007 | Nakada | |
| 2008/0014798 A1 | 1/2008 | Pan | |
| 2009/0149065 A1* | 6/2009 | Pan ................. | H01R 12/00 439/607.13 |
| 2013/0203273 A1 | 8/2013 | Rathburn | |
| 2014/0051295 A1 | 2/2014 | Westman et al. | |
| 2014/0248796 A1 | 9/2014 | Pan | |
| 2014/0295705 A1 | 10/2014 | Lee et al. | |
| 2015/0194771 A1 | 7/2015 | Pan | |
| 2015/0303618 A1 | 10/2015 | Lee et al. | |
| 2015/0318642 A1 | 11/2015 | Lee et al. | |
| 2016/0093985 A1 | 3/2016 | Zhang et al. | |
| 2016/0322760 A1 | 11/2016 | Long et al. | |
| 2018/0166828 A1 | 6/2018 | Gailus | |
| 2019/0044284 A1 | 2/2019 | Dunham | |
| 2019/0097356 A1* | 3/2019 | Horning ............... | H01R 13/502 |

FOREIGN PATENT DOCUMENTS

| | | | |
|---|---|---|---|
| CN | 2571026 Y | | 9/2003 |
| CN | 1491465 A | | 4/2004 |
| CN | 1592990 A | | 3/2005 |
| CN | 2682605 Y | | 3/2005 |
| CN | 101159354 A | | 4/2008 |
| CN | 201142392 Y | * | 10/2008 |
| CN | 101330172 A | | 12/2008 |
| CN | 101527409 A | | 9/2009 |
| CN | 101542640 A | | 9/2009 |
| CN | 101728667 A | | 6/2010 |
| CN | 101459299 B | | 11/2010 |
| CN | 102088148 A | | 6/2011 |
| CN | 102290653 A | | 12/2011 |
| CN | 102468562 A | | 5/2012 |
| CN | 202395246 U | | 8/2012 |
| CN | 102694308 A | | 9/2012 |
| CN | 102969621 A | | 3/2013 |
| CN | 103151650 A | | 6/2013 |
| CN | 103247918 A | | 8/2013 |
| CN | 103296546 A | * | 9/2013 |
| CN | 103311746 A | | 9/2013 |
| CN | 203288874 U | | 11/2013 |
| CN | 203589266 U | | 5/2014 |
| CN | 103928795 A | | 7/2014 |
| CN | 103988371 A | | 8/2014 |
| CN | 104037551 A | | 9/2014 |
| CN | 104241975 A | | 12/2014 |
| CN | 104396095 A | | 3/2015 |
| CN | 104505678 A | | 4/2015 |
| CN | 104577406 A | | 4/2015 |
| CN | 204304028 U | | 4/2015 |
| CN | 104779487 A | | 7/2015 |
| CN | 104810657 A | | 7/2015 |
| CN | 105024230 A | | 11/2015 |
| CN | 105470679 A | | 4/2016 |
| CN | 105470732 A | | 4/2016 |
| CN | 105470736 A | | 4/2016 |
| CN | 105612664 A | | 5/2016 |
| CN | 105703159 A | | 6/2016 |
| CN | 105742854 A | | 7/2016 |
| CN | 105958245 A | | 9/2016 |
| CN | 106207569 A | | 12/2016 |
| CN | 205846279 U | | 12/2016 |
| CN | 107104329 A | | 8/2017 |
| CN | 104009303 B | | 1/2018 |
| CN | 107565279 A | | 1/2018 |
| CN | 207530119 U | | 6/2018 |
| CN | 109390806 A | | 2/2019 |
| CN | 109546384 A | | 3/2019 |
| CN | 109546388 A | | 3/2019 |
| CN | 109586086 A | | 4/2019 |

(56) References Cited

FOREIGN PATENT DOCUMENTS

| | | | | |
|---|---|---|---|---|
| CN | 109599724 | A | | 4/2019 |
| CN | 109659726 | A | | 4/2019 |
| CN | 109841981 | A | | 6/2019 |
| CN | 109950721 | A | | 6/2019 |
| CN | 208955335 | U | | 6/2019 |
| CN | 109994892 | A | | 7/2019 |
| CN | 209056665 | U | | 7/2019 |
| CN | 110165448 | A | | 8/2019 |
| CN | 110247233 | A | | 9/2019 |
| CN | 110299649 | A | | 10/2019 |
| CN | 110323622 | A | | 10/2019 |
| CN | 110544850 | A | * | 12/2019 ........... H01R 12/716 |
| CN | 110600943 | A | | 12/2019 |
| CN | 110649407 | A | | 1/2020 |
| CN | 110718815 | A | | 1/2020 |
| CN | 110808499 | A | * | 2/2020 ........... H01R 13/502 |
| CN | 110838635 | A | | 2/2020 |
| CN | 111092342 | A | | 5/2020 |
| CN | 111370890 | A | | 7/2020 |
| CN | 111682366 | A | | 9/2020 |
| CN | 111682369 | A | | 9/2020 |
| JP | 2000-058172 | A | | 2/2000 |
| TW | 415133 | B | | 12/2000 |
| TW | 459428 | B | | 10/2001 |
| TW | M461166 | U1 | | 9/2013 |
| TW | I414111 | B | | 11/2013 |
| TW | I452767 | B | | 9/2014 |
| TW | I528659 | B | | 4/2016 |
| TW | I545845 | B | | 8/2016 |
| TW | M537321 | U | | 2/2017 |
| TW | 201733225 | A | | 9/2017 |
| TW | I600231 | B | | 9/2017 |
| TW | 201810825 | A | | 3/2018 |
| TW | I623154 | B | | 5/2018 |
| TW | 201834333 | A | | 9/2018 |
| TW | 201841440 | A | | 11/2018 |
| TW | I648925 | B | | 1/2019 |
| TW | M585436 | U | | 10/2019 |
| TW | 201943158 | A | | 11/2019 |
| TW | M591270 | U | | 2/2020 |
| TW | M593091 | U | | 4/2020 |
| TW | 202046584 | A | | 12/2020 |
| WO | WO 2016/168820 | A1 | | 10/2016 |
| WO | WO 2017/106266 | A1 | | 6/2017 |

OTHER PUBLICATIONS

Chinese Office Action and Search Report for Chinese Application No. 202011577786.5, dated Feb. 16, 2022, is attached.
Chinese Office Action and Search Report for Chinese Application No. 202110035372.8, dated Jan. 6, 2022, is attached.
Taiwanese Office Action and Search Report for Taiwanese Application No. 110104064, dated Dec. 9, 2021, is attached.
Taiwanese Office Action and Search Report for Taiwanese Application No. 110104068, dated Jan. 26, 2022, is attached.
Taiwanese Office Action and Search Report for Taiwanese Application No. 110117853, dated Feb. 9, 2022, is attached.

* cited by examiner

BACKPLANE CONNECTOR WITH IMPROVED STRUCTURE STRENGTH

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202010822431.1, filed on Aug. 17, 2020 and titled "BACKPLANE CONNECTOR", the entire content of which is incorporated herein by reference.

TECHNICAL FIELD

The present disclosure relates to a backplane connector which belongs to a technical field of connectors.

BACKGROUND

Existing backplane connectors usually include a housing and a plurality of terminal modules mounted to the housing. Each terminal module includes an insulating block and a plurality of conductive terminals fixed in the insulating block. The insulating block has a plurality of terminal receiving holes. Contact portions of the conductive terminals extend into the terminal receiving holes to be mated with a mating connector. The housing includes a mating hole for receiving and positioning the terminal module. However, the structural strength of this design of the housing is weak, resulting in poor durability of the backplane connectors.

SUMMARY

An object of the present disclosure is to provide a backplane connector having a housing with better structure strength.

In order to achieve the above object, the present disclosure adopts the following technical solution: a backplane connector, comprising: a housing comprising a base; a first side wall extending from one end of the base; a second side wall extending from the other end of the base; and a plurality of terminal modules assembled to the housing, each terminal module comprising a first signal terminal and a second signal terminal; wherein the base, the first side wall and the second side wall jointly form a receiving space for at least partially receiving a mating connector; and wherein the housing comprises a plurality of insulating protrusions integrally extending from the base, the insulating protrusions are spaced apart from each other, the insulating protrusions extend into the receiving space, and the plurality of terminal modules are received in the insulating protrusions.

Compared with the prior art, the housing of the present disclosure includes a plurality of insulating protrusions integrally extending from the base. The insulating protrusions are adapted to receive the plurality of terminal modules. Through the integral forming of the base and the insulating protrusions, the structural strength of the housing is improved and the durability of the backplane connector is improved accordingly.

DETAILED DESCRIPTION

Figure 1:
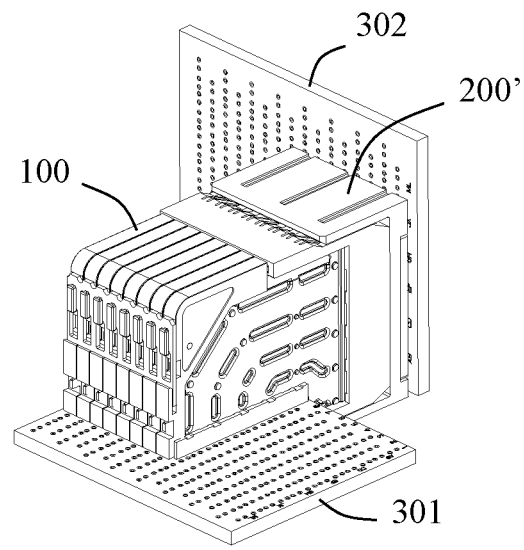
FIG. 1 is a perspective view of a backplane connector assembly in accordance with an embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
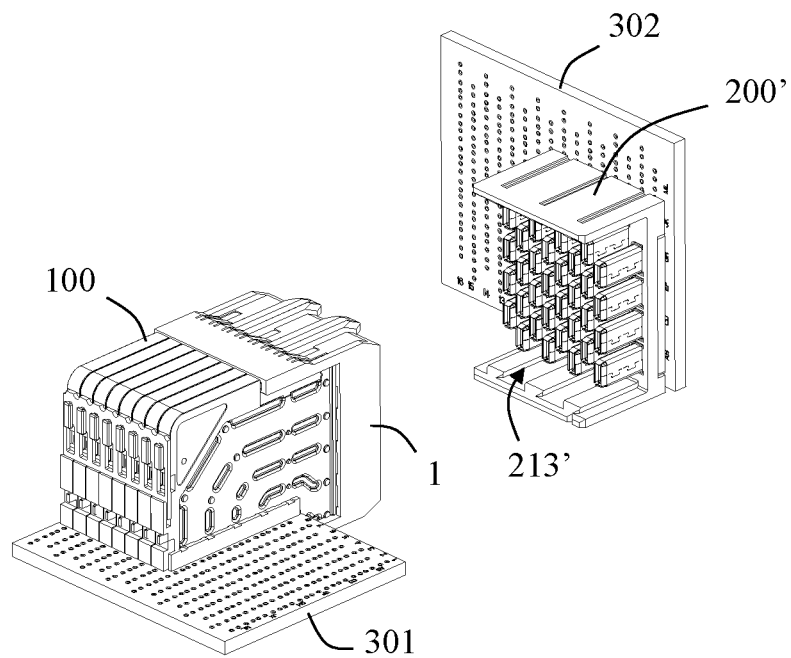
FIG. 2 is a partial perspective exploded view of FIG. 1.
Figure 3:
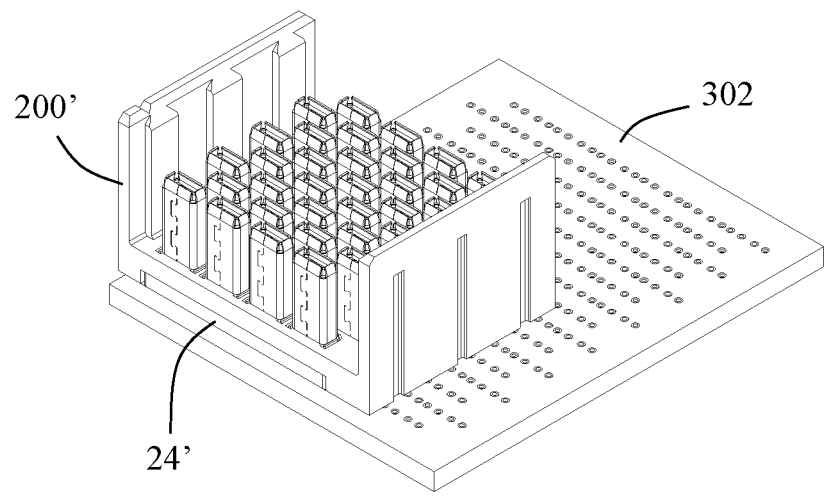
FIG. 3 is another view of the second backplane connector in FIG. 2 when it is mounted on a second circuit board.
Figure 4:
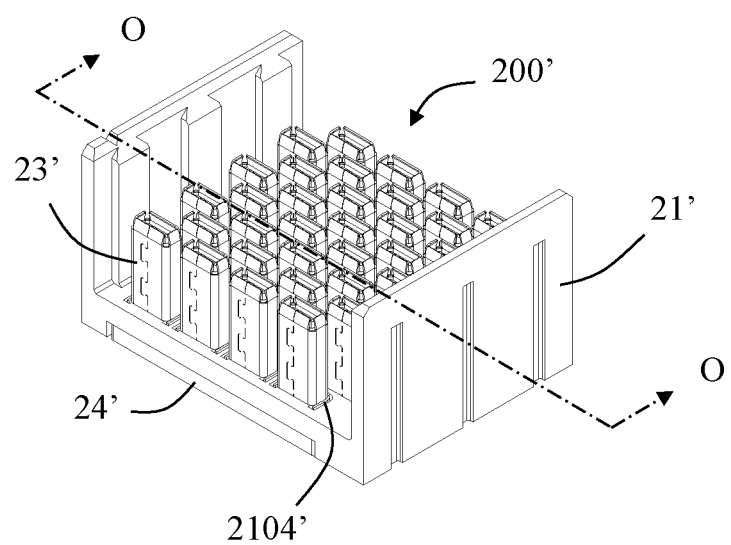
FIG. 4 is a perspective view of the second backplane connector in FIG. 3.
Figure 5:
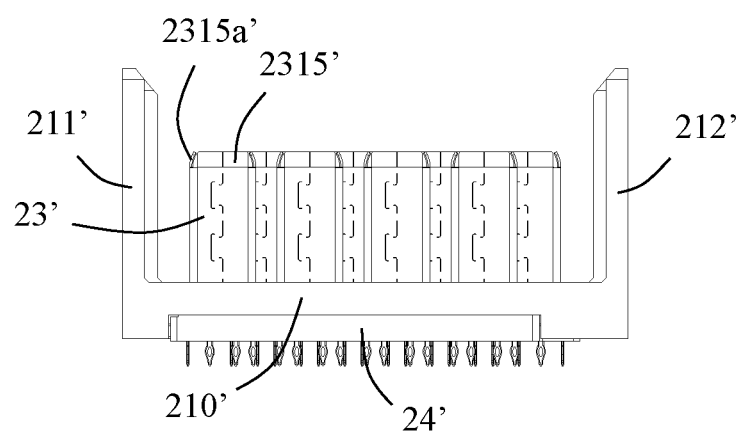
FIG. 5 is a front view of FIG. 4.
Figure 6:
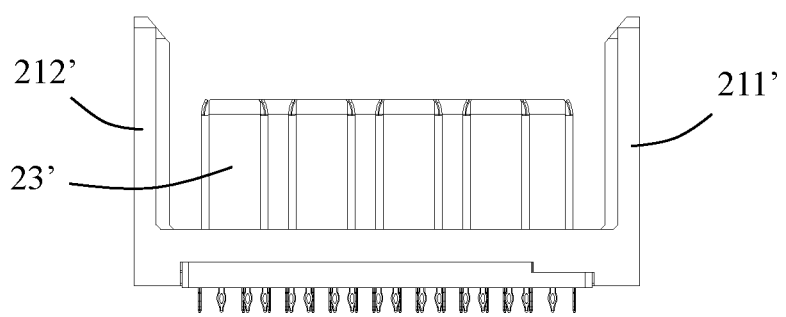
FIG. 6 is a rear view of FIG. 4.
Figure 7:
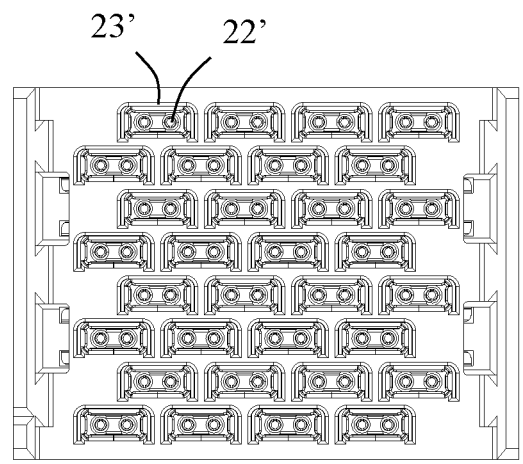
FIG. 7 is a top view of FIG. 4.
Figure 8:
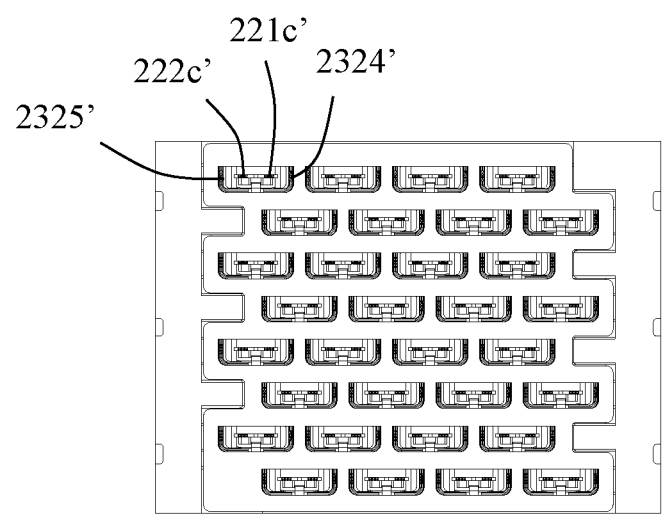
FIG. 8 is a bottom view of FIG. 4.

Referring to FIGS. 1 and 2, an embodiment of the present disclosure discloses a backplane connector assembly which includes a first backplane connector 100, a second backplane connector 200' for mating with the first backplane connector 100, a first circuit board 301 mounted with the first backplane connector 100, and a second circuit board 302 mounted with the second backplane connector 200'. In the illustrated embodiment of the present disclosure, the first backplane connector 100 and the second backplane connector 200' are mated in an orthogonal manner. The first circuit board 301 is perpendicular to the second circuit board 302.

Referring to FIGS. 3 to 11, the second backplane connector 200' includes a housing 21', a plurality of terminal modules 22' assembled to the housing 21', a plurality of metal shield surrounding members 23' fixed to the second housing 21' and enclosing corresponding terminal modules 22', and a mounting block 24' mounted to the housing 21'.

Referring to FIGS. 9 and 13 to 15, the housing 21' is made of insulating material and includes a base 210', a first side wall 211' extending upwardly from one side of the base 210', and a second side wall 212' extending upwardly from the other side of the base 210'. The base 210', the first side wall 211' and the second side wall 212' jointly form a receiving space 213' for receiving a part of the first backplane connector 100. In the illustrated embodiment of the present disclosure, the first side wall 211' and the second side wall 212' are parallel to each other and both are perpendicular to the base 210'.

In the illustrated embodiment of the present disclosure, the housing 21' further includes a plurality of insulating protrusions 214' integrally extending from the base 210'. The plurality of insulating protrusions 214' are spaced apart from one another. The plurality of insulating protrusions 214' extend upwardly into the receiving space 213'. The terminal modules 22' are installed in the insulating protrusions 214'. The plurality of insulating protrusions 214' are disposed in multiple rows along a front-rear direction. The insulating protrusions 214' in two adjacent rows are disposed in a staggered manner, that is, the insulating protrusions 214' in the same position in two adjacent rows are not in alignment with each other in the front-rear direction. The base 210' includes a top surface 2101' exposed in the receiving space 213', a bottom surface 2102' opposite to the top surface 2101', two mounting protrusions 2103' respectively protruding downwardly from opposite sides of the bottom surface 2102', and a receiving groove 2100' located between the two mounting protrusions 2103'. The receiving groove 2100' is adapted for receiving the mounting block 24'.

Figure 14:
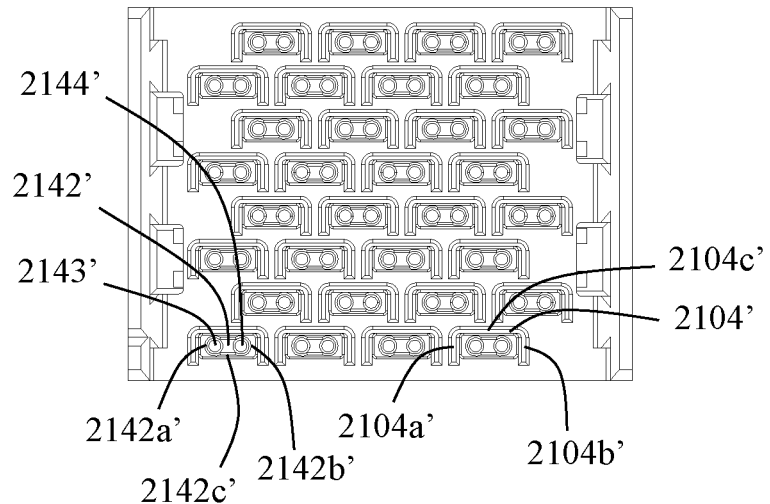
FIG. 14 is a top view of a housing in FIG. 11.
Figure 15:
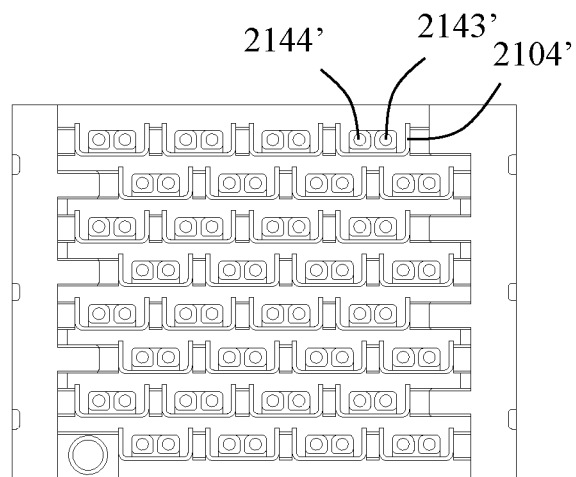
FIG. 15 is a bottom view of the housing in FIG. 11.

Referring to FIG. 14, the base 210' includes a plurality of positioning grooves 2104' extending through the top surface 2101'. In the illustrated embodiment of the present disclosure, each positioning groove 2104' is substantially U-shaped. The positioning groove 2104' is arranged around the corresponding insulating protrusion 214' and is used to install the corresponding metal shield surrounding member 23'. Specifically, each positioning groove 2104' includes a first positioning groove 2104a' extending along the front-rear direction, a second positioning groove 2104b' parallel to the first positioning groove 2104a', and a third positioning groove 2104c' communicating the first positioning groove 2104a' and the second positioning groove 2104b'. The third positioning groove 2104c' is perpendicular to the first positioning groove 2104a' and the second positioning groove 2104b'. In the illustrated embodiment of the present disclosure, each positioning groove 2104' also extends through the bottom surface 2102' so as to communicate with the receiving groove 2100'.

Figure 12:
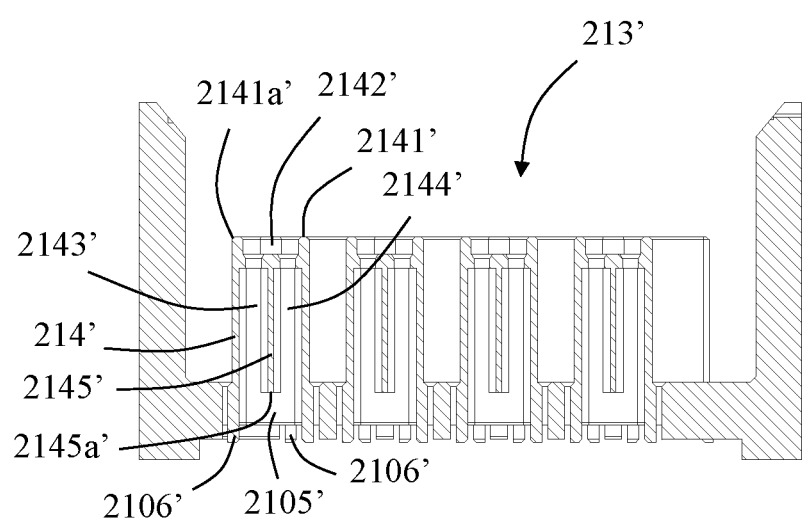
FIG. 12 is a schematic cross-sectional view taken along line L-L in FIG. 11.
Figure 13:
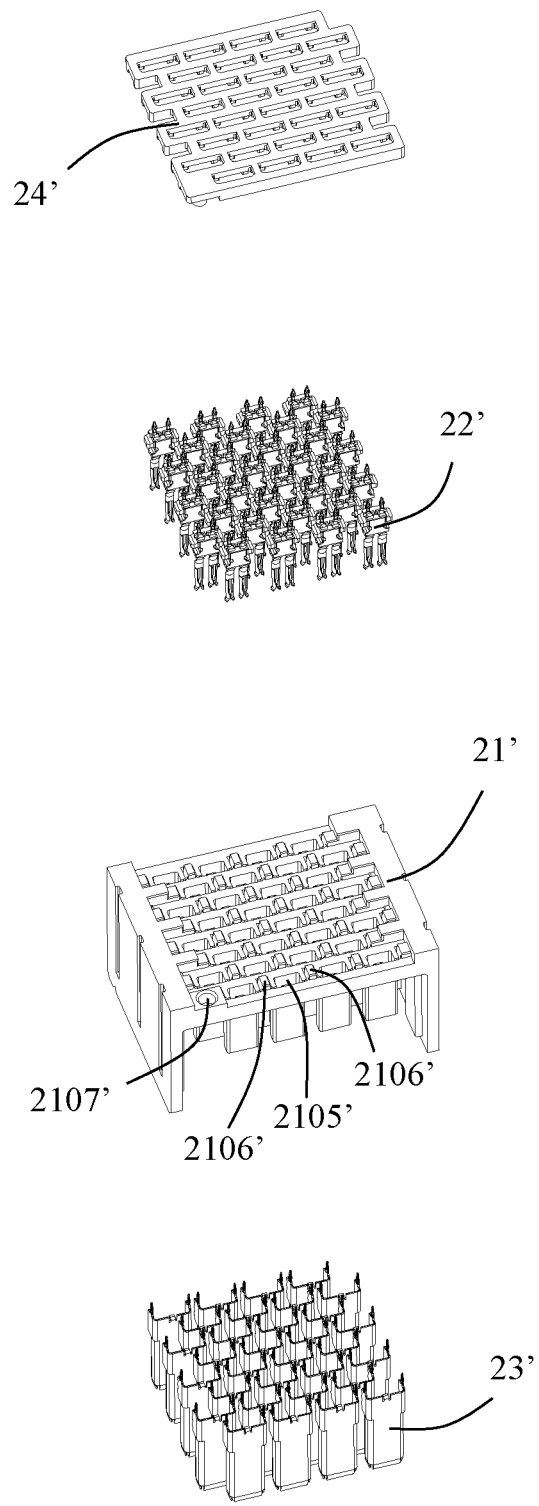
FIG. 13 is a perspective exploded view of the second backplane connector from another angle.

Referring to FIGS. 12 and 13, the bottom surface 2102' of the base 210' is also provided with a plurality of terminal receiving grooves 2105', a plurality of positioning protrusions 2106' located on both sides of each terminal receiving groove 2105', and a positioning hole 2107' for mating with the mounting block 24'. The terminal receiving groove 2105' extends through the bottom surface 2102' and is recessed into the insulating protrusion 214'. Referring to FIG. 12, each insulating protrusion 214' is roughly cuboid shaped and includes an upper end surface 2141', a communicating groove 2142' extending through the upper end surface 2141', and a terminal receiving hole located at the bottom of the communicating groove 2142'. The terminal receiving hole communicates with the terminal receiving groove 2105'. In the illustrated embodiment of the present disclosure, the terminal receiving hole includes a first terminal receiving hole 2143' and a second terminal receiving hole 2144' arranged in parallel. Both the first terminal receiving hole 2143' and the second terminal receiving hole 2144' are round holes. The housing 21' is further provided with a partition 2145' for separating the first terminal receiving hole 2143' and the second terminal receiving hole 2144'. The partition 2145' has a bottom surface 2145a'. Four corners of the upper end surface 2141' include guiding inclined surfaces 2141a' for guiding installation of the metal shielding surrounding member 23'. Referring to FIG. 14, the communicating groove 2142' includes a first arc-shaped groove 2142a' corresponding to the first terminal receiving hole 2143', a second arc-shaped groove 2142b' corresponding to the second terminal receiving hole 2144', and a straight slot 2142c' communicating the first arc-shaped groove 2142a' and the second arc-shaped groove 2142b'. The arc of the first arc-shaped groove 2142a' is a major arc, and the center of the major arc overlaps with the center of the first terminal receiving hole 2143'. Similarly, the arc of the second arc-shaped groove 2142b' is a major arc and the center of the major arc overlaps with the center of the second terminal receiving hole 2144'.

Figure 9:
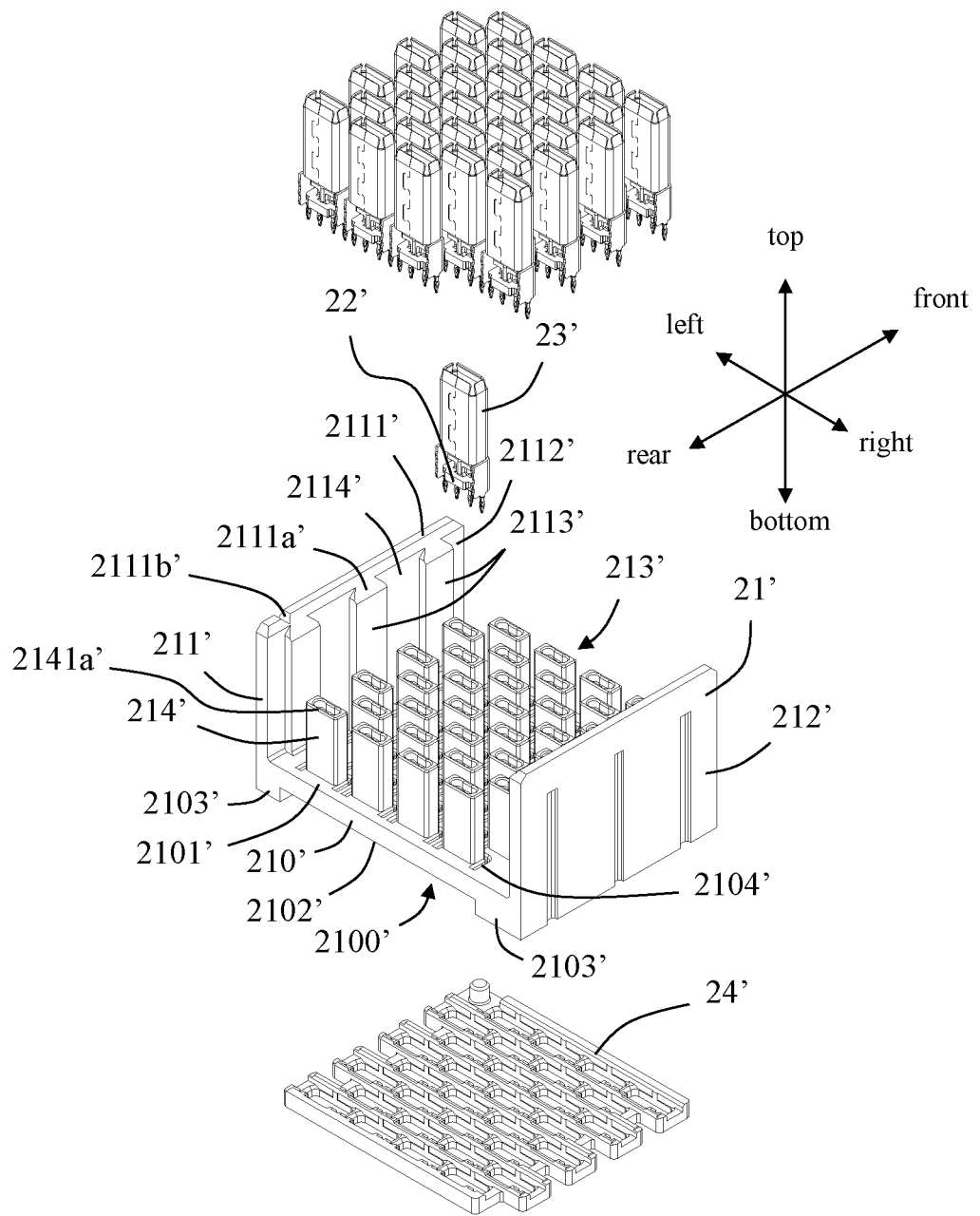
FIG. 9 is a partial perspective exploded view of the second backplane connector in FIG. 3.

Referring to FIG. 9, the first side wall 211' includes a first top surface 2111', a first inner side surface 2112', a plurality of first protrusions 2113' protruding inwardly from the first inner side surface 2112' into the receiving space 213', and a plurality of first positioning groove 2114' each of which is located between two adjacent first protrusions 2113'. In the illustrated embodiment of the present disclosure, the first positioning groove 2114' is a dovetail groove. The first positioning groove 2114' has two oppositely arranged inclined surfaces, thereby making the width of the first positioning groove 2114' close to the first inner side surface 2112 be larger than the width of the first positioning groove 2114' away from the first inner side surface 2112'. In addition, the first top surface 2111' has a first guiding inclined surface 2111a' inclined toward the receiving space 213' and a notch 2111b' extending upwardly through the first top surface 2111'. The notch 2111b' can serve an identification function to prevent the first backplane connector 100 from being inserted at a wrong angle. The first guiding inclined surface 2111a' further extends to the top of the plurality of first protrusions 2113'.

Figure 10:
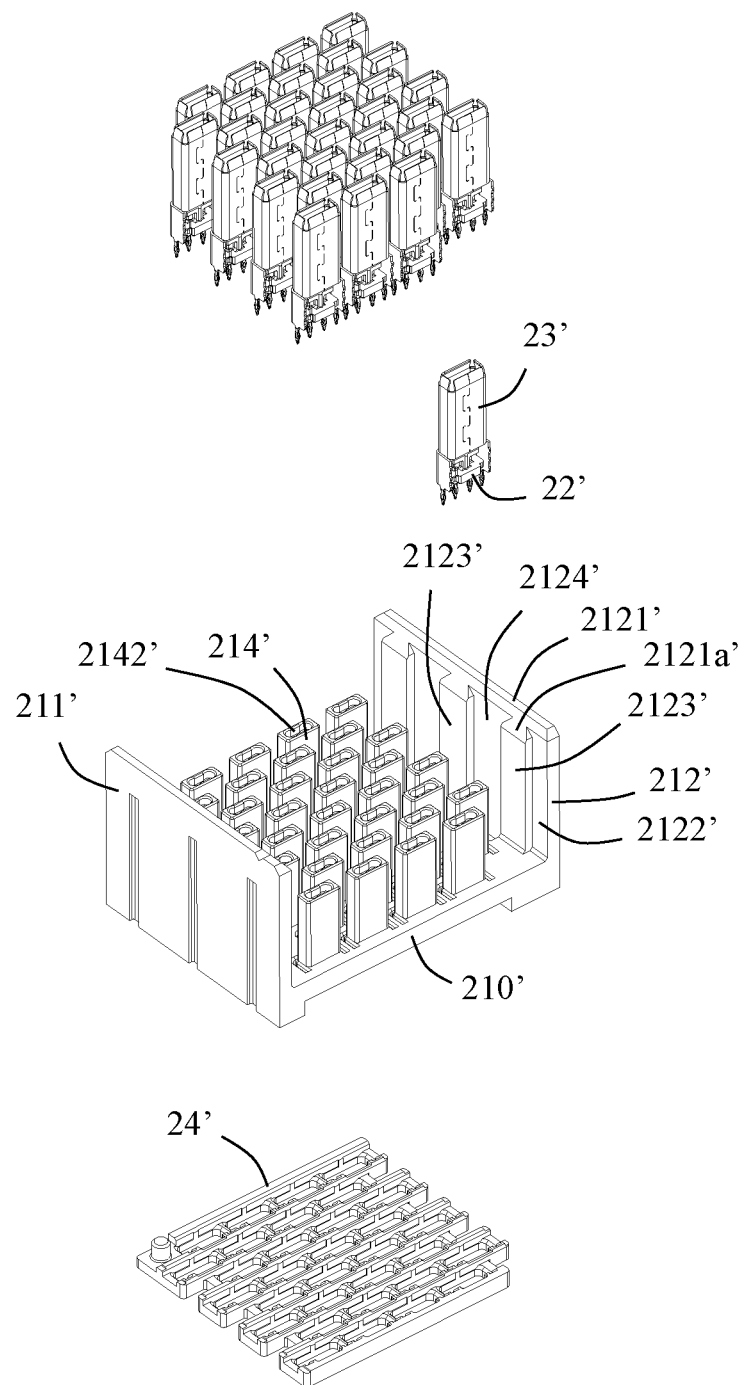
FIG. 10 is a partial perspective exploded view of FIG. 9 from another angle.
Figure 11:
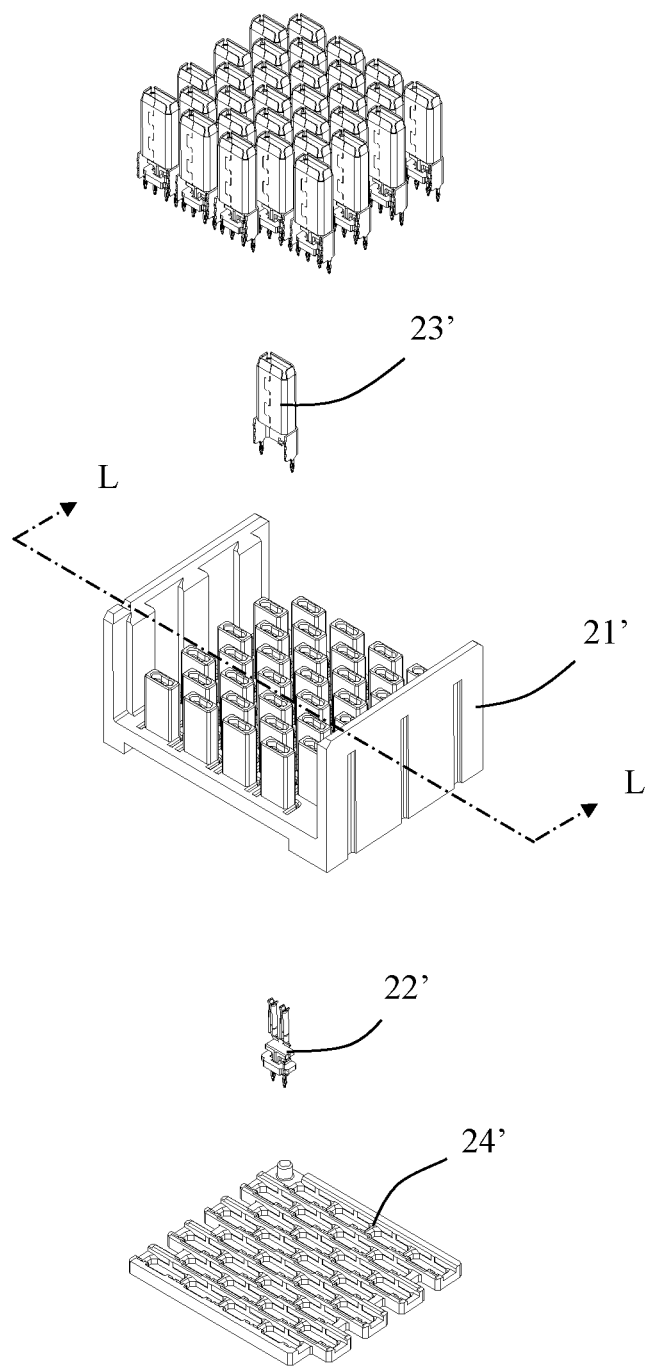
FIG. 11 is a further perspective exploded view of FIG. 9.

Referring to FIG. 10, the second side wall 212' includes a second top surface 2121', a second inner side surface 2122', a plurality of second protrusions 2123' protruding inwardly from the second inner side surface 2122' into the receiving space 213', and a plurality of second positioning grooves 2124' each of which is located between two adjacent second protrusions 2123'. In the illustrated embodiment of the present disclosure, the second positioning groove 2124' is a dovetail groove. The second positioning groove 2124' has two opposite inclined surfaces, thereby making the width of the second positioning groove 2124' close to the second inner side surface 2122' be larger than the width of the second positioning groove 2124' away from the second inner side surface 2122'. In addition, the second top surface 2121' has a second guiding inclined surface 2121a' which is inclined toward the receiving space 213'. The second guiding inclined surface 2121a' further extends to the top of the plurality of second protrusions 2123'. The first guiding inclined surface 2111a' and the second guiding inclined surface 2121a' are used to guide the first backplane connector 100 to be inserted into the receiving space 213'. In the illustrated embodiment of the present disclosure, the first protrusions 2113' and the second protrusions 2123' are symmetrically disposed on opposite sides of the housing 21'. The first positioning grooves 2114' and the second positioning grooves 2124' are also symmetrically disposed on opposite sides of the housing 21'.

Figure 16:
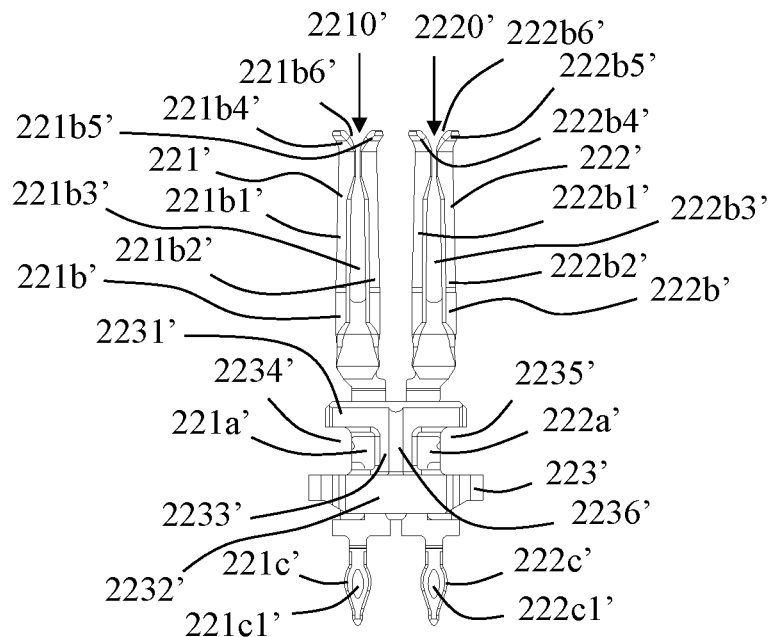
FIG. 16 is a front view of a terminal module in FIG. 11.
Figure 17:
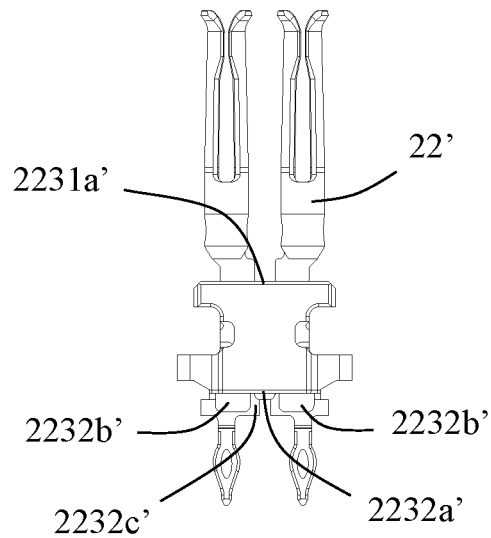
FIG. 17 is a rear view of the terminal module in FIG. 11.
Figure 18:
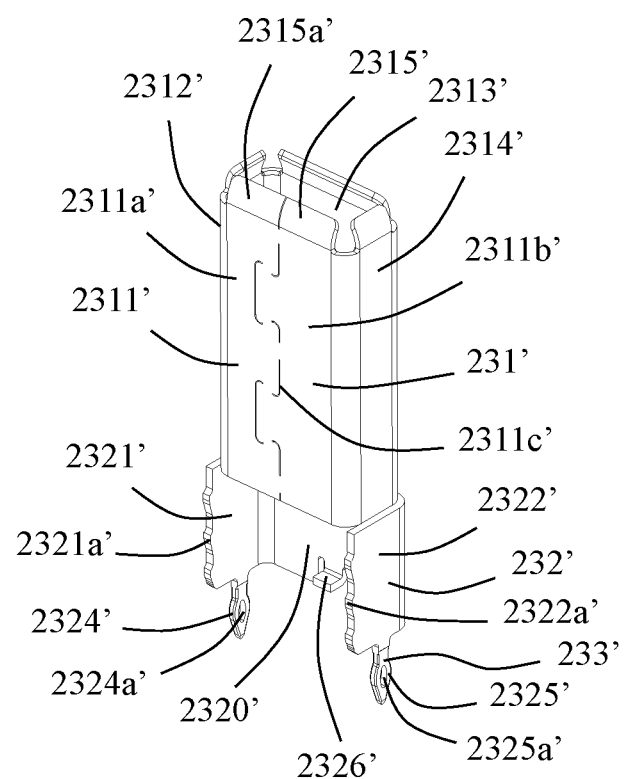
FIG. 18 is a perspective schematic view of a metal shield surrounding member.
Figure 19:
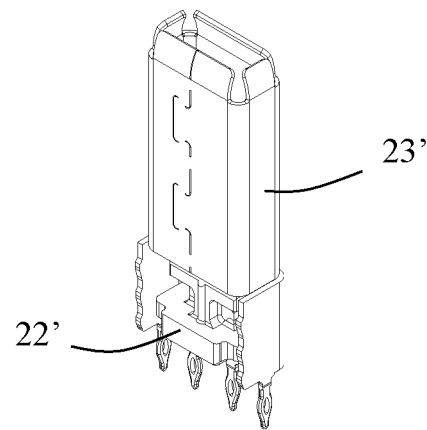
FIG. 19 is a perspective schematic view of the metal shield surrounding member sleeved on the terminal module.
Figure 20:
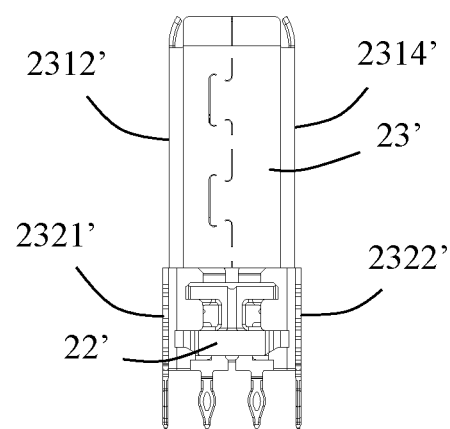
FIG. 20 is a front view of FIG. 19.
Figure 21:
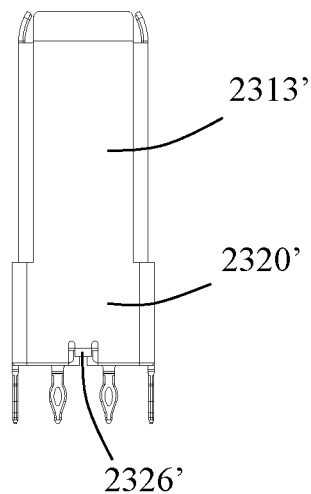
FIG. 21 is a rear view of FIG. 19.
Figure 22:
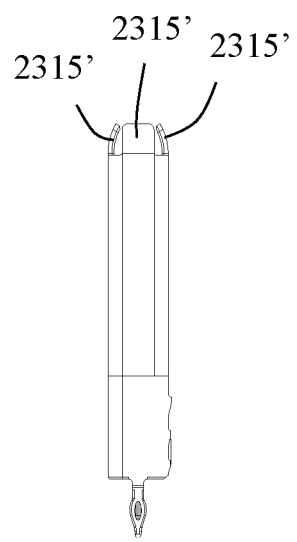
FIG. 22 is a left side view of FIG. 19.
Figure 23:
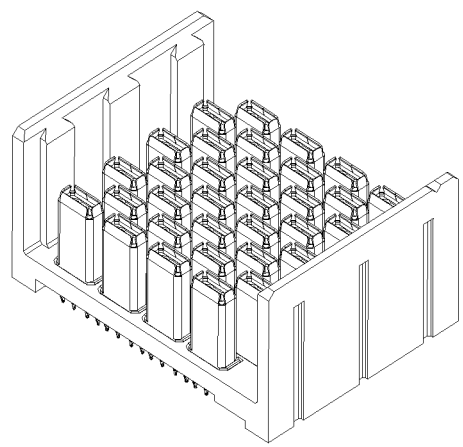
FIG. 23 is a partial perspective exploded view of the second backplane connector.
Figure 23:
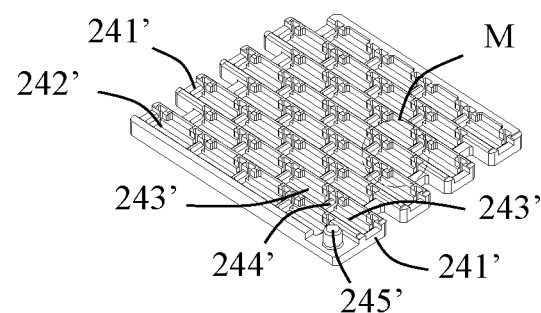
Figure 24:
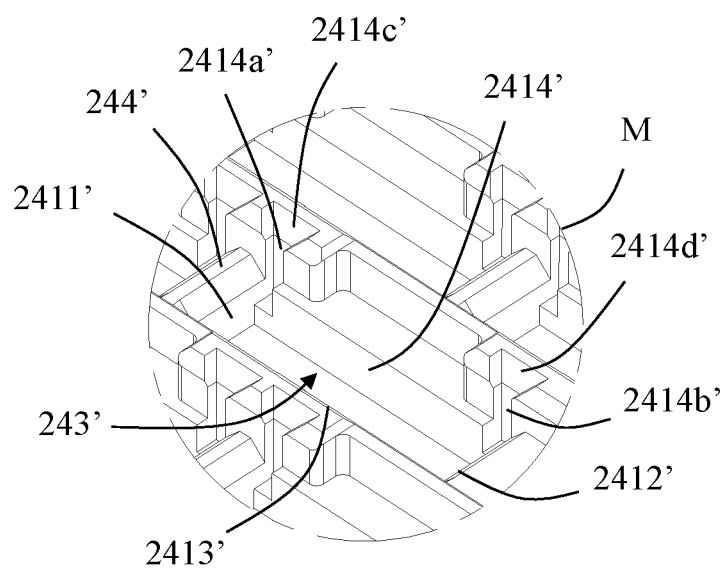
FIG. 24 is a partial enlarged view of a circled part M in FIG. 23.
Figure 25:
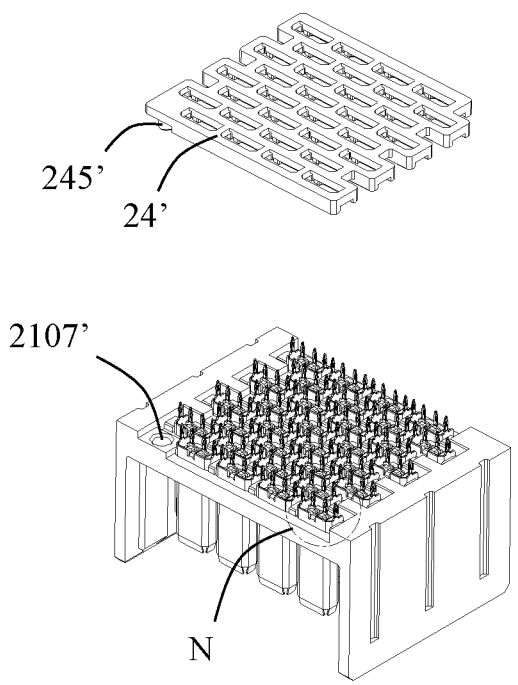
FIG. 25 is a partially exploded perspective view of FIG. 23 from another angle.
Figure 26:
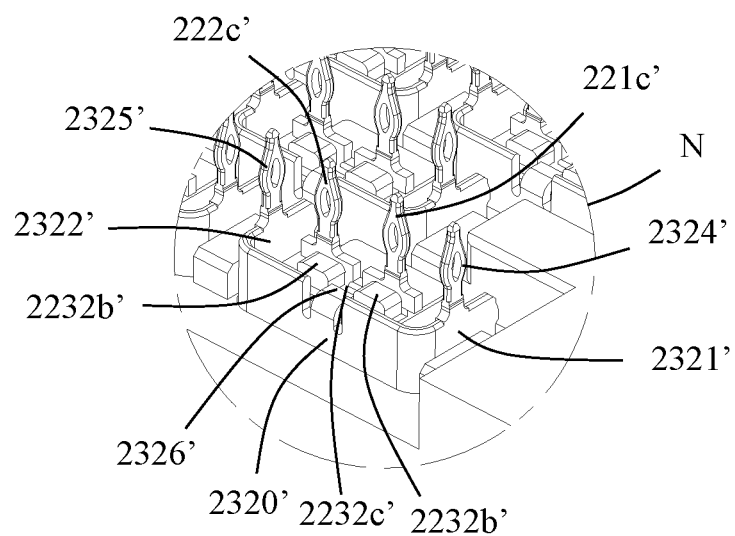
FIG. 26 is a partial enlarged view of a circled part N in FIG. 25.
Figure 27:
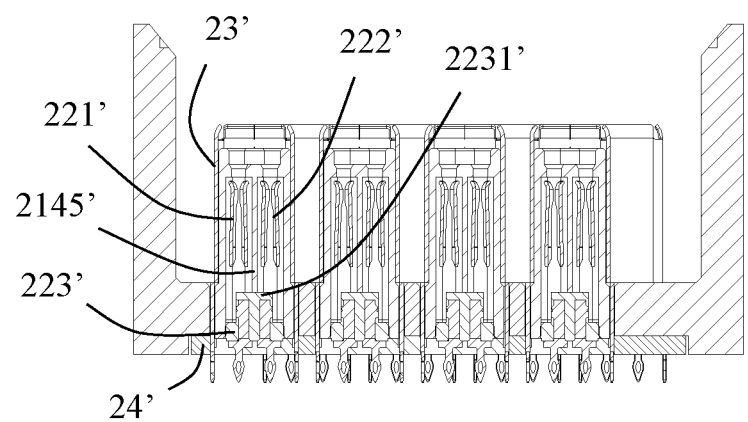
FIG. 27 is a schematic cross-sectional view taken along line O-O in FIG. 4.

Referring to FIGS. 16 and 17, each terminal module 22' includes a first signal terminal 221', a second signal terminal 222', and an insulating block 223' fixed to the first signal terminal 221' and the second signal terminal 222'. In an embodiment of the present disclosure, the first signal terminal 221' and the second signal terminal 222' are insert-molded with the insulating block 223'. In an embodiment of the present disclosure, the first signal terminal 221' and the second signal terminal 222' form a pair of differential signal terminals. In the illustrated embodiment of the present disclosure, the first signal terminal 221' and the second signal terminal 222' are symmetrically arranged along a central axis of the insulating block 223'.

The first signal terminal 221' includes a first fixing portion 221a' fixed to the insulating block 223', a first contact portion 221b' extending upwardly from the first fixing portion 221a', and a first mounting foot 221c' extending downwardly from the first fixing portion 221a'. The first mounting foot 221c' has a first fisheye hole 221c1' so that the first mounting foot 221c' has a certain elasticity. As a result, it facilitates pressing the first mounting foot 221c' into the conductive hole of the second circuit board 302' so as to achieve electrical conduction. The first contact portion 221b' has a two-half structure and includes a first contact piece 221b1', a second contact piece 221b2', and a first insertion hole 2210' located between the first contact piece 221b1' and the second contact piece 221b2'. The first contact piece 221b1' and the second contact piece 221b2' are separated by two first slots 221b3', so that the first contact portion 221b' has better elasticity, thereby improving the reliability of mating with the conductive terminals of a mating connector. In addition, the first contact piece 221b1' also includes a first flared portion 221b4' at its end. The second contact piece 221b2' also includes a second flared portion 221b5' at its end. The first flared portion 221b4' and the second flared portion 221b5' form a first bell mouth 221b6' communicating with the first insertion hole 2210' in order to guide the insertion of the conductive terminal of the mating connector.

The second signal terminal 222' includes a second fixing portion 222a' fixed to the insulating block 223', a second contact portion 222b' extending upwardly from the second fixing portion 222a', and a second mounting foot 222c' extending downwardly from the second fixing portion 222a'. The second mounting foot 222c' has a second fisheye hole 222c1' so that the second mounting foot 222c' has a certain elasticity. As a result, it facilitates pressing the second mounting foot 222c' into the conductive hole of the second circuit board 302' so as to achieve electrical conduction. The second contact portion 222b' has a two-half structure and includes a third contact piece 222b1', a fourth contact piece 222b2', and a second insertion hole 2220' located between the third contact piece 222b1' and the fourth contact piece 222b2'. The third contact piece 222b1' and the fourth contact piece 222b2' are separated by two second slots 222b3', so that the second contact portion 222b' has better elasticity, thereby improving the reliability of mating with the conductive terminals of a mating connector. In addition, the third contact piece 222b1' also includes a third flared portion 222b4' at its end. The fourth contact piece 222b2' also includes a fourth flared portion 222b5' at its end. The third flared portion 222b4' and the fourth flared portion 222b5' form a second bell mouth 222b6' communicating with the second insertion hole 2220' in order to guide the insertion of the conductive terminal of the mating connector.

In the illustrated embodiment of the present disclosure, the insulating block 223' includes a top portion 2231', a bottom portion 2232', and a connection portion 2233' connecting the top portion 2231' and the bottom portion 2232'. The top portion 2231' is parallel to the bottom portion 2232'. The connection portion 2233' is perpendicular to the top portion 2231' and the bottom portion 2232'. An upper end and a lower end of the connection portion 2233' is connected to a middle of the top portion 2231' and a middle of the bottom portion 2232', respectively. The top portion 2231' has a top surface 2231a'. The length of the top portion 2231' is shorter than the length of the bottom portion 2232'. The insulating block 223' also includes a first opening 2234' and a second opening 2235' located between the top portion 2231' and the bottom portion 2232'. The first opening 2234' and the second opening 2235' are respectively located on both sides of the connection portion 2233'. The first fixing portion 221a' of the first signal terminal 221' is partially exposed in the first opening 2234', and the second fixing portion 222a' of the second signal terminal 222' is partially exposed in the second opening 2235' for adjusting impedance. The bottom portion 2232' includes a bottom surface 2232a', two protrusions 2232b' protruding downwardly from the bottom surface 2232a', and a positioning groove 2232c' located between the two protrusions 2232b'. The two protrusions 2232b' respectively abut against the bottom end of the first fixing portion 221a' and the bottom end of the second fixing portion 222a'. The outer peripheral surface of the insulating block 223' also includes a plurality of ribs 2236'. The outer surface of the rib 2236' is in the shape of a semicircular arc. In the illustrated embodiment of the present disclosure, the rib 2236' is located in the middle position of the two sides of the top portion 2231' and in the middle position of the front end surface of the connection portion 2233'. Of course, in other embodiments, the ribs 2236' can also be arranged on both sides of the bottom portion 2232' and/or the front end surface of the bottom portion 2232'. The rib 2236' is used to abut against the housing 21' in order to improve the reliability of installation.

Referring to FIGS. 18 to 22. In the illustrated embodiment of the present disclosure, the metal shield surrounding member 23' is formed by stamping, bending and riveting a metal plate. The metal shield surrounding member 23' includes a hollow portion 231', a mounting portion 232' extending downwardly from the hollow portion 231', and a plurality of mounting feet 233' extending downwardly from the mounting portion 232'. The hollow portion 231' includes a first side wall 2311', a second side wall 2312', a third side wall 2313' and a fourth side wall 2314' which are connected in sequence. The first side wall 2311' is opposite to the third side wall 2313', and the second side wall 2312' is opposite to the fourth side wall 2314', thereby forming an enclosed shielding cavity. Of course, in other embodiments, the shielding cavity may also be of a non-enclosed type. For example, the hollow portion 231' includes a first side wall 2311', a second side wall 2312', and a third side wall 2313' which are connected in sequence, so that the hollow portion 231' is substantially U-shaped. In the illustrated embodiment of the present disclosure, areas of the first side wall 2311' and the third side wall 2313' are larger than areas of the second side wall 2312' and the fourth side wall 2314'. Each end of the first side wall 2311', the second side wall 2312', the third side wall 2313' and the fourth side wall 2314' includes a deflection portion 2315' which is bent inwardly. The deflection portions 2315' are independent from one another so that they can be bent independently in order to avoid mutual interference. Each deflection portion 2315' has a guiding portion 2315a' on its outer surface. By providing the deflection portions 2315', a constricted opening can be formed at the end of the metal shield surrounding member 23'. The guiding portion 2315a' can guide the deflection portions 2315' from being easily inserted into the first backplane connector 100. In the illustrated embodiment of the present disclosure, the first side wall 2311' includes a first wall portion 2311a' and a second wall portion 2311b'. The first wall portion 2311a' and the second wall portion 2311b' are fixed together by riveting. A riveting line 2311c' is formed at a junction of the first wall portion 2311a' and the second wall portion 2311b'. In other embodiments of the present disclosure, it is also possible that only the ends of at least three of the first side wall 2311', the second side wall 2312', the third side wall 2313' and the fourth side wall 2314' which are connected to each other, are provided with the deflection portions 2315' bent inwardly. For example, the deflection portions 2315' bent inwardly are provided at the ends of the second side wall 2312', the third side wall 2313' and the fourth side wall 2314' which are sequentially connected.

In the illustrated embodiment of the present disclosure, the mounting portion 232' is substantially U-shaped, and includes a connecting portion 2320', a first bending portion 2321' bent from one side of the connecting portion 2320', a second bending portion 2322' bent from the other side of the connecting portion 2320', a first tail portion 2324' extending downwardly from the first bending portion 2321', and a second tail portion 2325' extending downwardly from the second bending portion 2322'. The first bending portion 2321' is fixed in the first positioning groove 2104a'. The second bending portion 2322' is fixed in the second positioning groove 2104b'. The connecting portion 2320' is fixed in the third positioning groove 2104c'. The connecting portion 2320' is coplanar with the third side wall 2313'. The first bending portion 2321' and the second bending portion 2312' are located on the same side. The first bending portion 2321' protrudes outwardly beyond the second side wall 2312'. The second bending portion 2322' and the fourth side wall 2314' are located on the same side. The second bending portion 2322' protrudes outwardly beyond the fourth side wall 2314'. The mounting portion 232' also includes a bottom retaining portion 2326' located at the connecting portion 2320'. In the illustrated embodiment of the present disclosure, when the metal shield surrounding member 23' is not mounted to the insulating protrusion 214', the retaining portion 2326' and the connecting portion 2320' are located in the same plane. After the metal shield surrounding member 23' is installed to the insulating protrusion 214', the retaining portion 2326' is bent inwardly (that is, in a direction toward the first side wall 2311') so that the retaining portion 2326' is perpendicular to the connecting portion 2320'. The retaining portion 2326' is located in the middle of the bottom edge of the connecting portion 2320'. A plurality of first barbs 2321a' are further provided on the side of the first bending portion 2321' away from the third side wall 2313'. A plurality of second barbs 2322a' are further provided on the side of the second bending portion 2322' away from the third side wall 2313'. The first barbs 2321a' and the second barbs 2322a' both extend beyond the first side wall 2311' to be fixed in the housing 21'. The first tail portion 2324' is provided with a first fisheye hole 2324a', so that the first tail portion 2324' has a certain degree of elasticity. Therefore, the first tail portion 2324' can be easily pressed into the conductive hole of the second circuit board 302 for achieving electrical conduction. The second tail portion 2325' is provided with a second fisheye hole 2325a', so that the second tail portion 2325' has a certain elasticity. Therefore, the second tail portion 2325' can be easily pressed into the conductive hole of the second circuit board 302 for achieving electrical conduction. In the illustrated embodiment of the present disclosure, the first tail portion 2324' and the second tail portion 2325' are arranged parallel to each other and are in alignment with each other along a left-right direction. The first tail portion 2324' and the second tail portion 2325' are perpendicular to the first mounting foot 221c' and the second mounting foot 222c'.

Referring to FIGS. 23 to 27, the mounting block 24' includes a plurality of mounting bars 241' arranged in a staggered manner and connected as a whole. Each mounting bar 241' includes a positioning groove 242' for positioning the mounting portion 232'. Specifically, each mounting bar 241' includes a plurality of openings 243' in a substantially rectangular shape, and the openings 243' of two adjacent rows of the mounting bars 241' are arranged in a staggered manner. Two adjacent openings 241' on the same mounting bar 241' are separated by a partition wall 244' located between the two adjacent openings 241'. The mounting block 24' includes a first inner side surface 2411', a second inner side surface 2412' opposite to the first inner side surface 2411', a third inner side surface 2413' connecting the first inner side surface 2411' and the second inner side surface 2412', and a fourth inner side surface 2414' connecting the first inner side surface 2411' and the second inner side surface 2412'. The fourth inner side surface 2414' is opposite to the third inner side surface 2413'. Opposite ends of the fourth inner side surface 2414' include a first opening 2414a' and a second opening 2414b', respectively. In addition, opposite ends of the fourth inner side surface 2414' include a first bell mouth 2414c' located above a first opening 2414a' and a second bell mouth 2414d' located above a second opening 2414b'. The first inner side surface 2411', the second inner side surface 2412' and the third inner side surface 2413' are connected to form a U-shape configuration for receiving the mounting portion 232'. The first bell mouth 2414c' and the first opening 2414a' are used to allow the first tail portions 2324' to pass through and achieve positioning. The second bell mouth 2414d' and the second opening 2414b' are used to allow the second tail portions 2325' to pass through and achieve positioning. In an embodiment of the present disclosure, the mounting block 24' is electroplated plastic so as to achieve a better shielding effect. The mounting block 24' includes a positioning post 245' for mating with the positioning hole 2107'.

When assembling, firstly, the plurality of metal shield surrounding members 23' are sleeved on the insulating protrusions 214' along a top-to-bottom direction, so that the hollow portions 231' enclose the insulating protrusions 214'. The U-shaped mounting portions 232' are inserted into the U-shaped positioning grooves 2104'. The first tail portions 2324' and the second tail portions 2325' respectively extend through the first positioning grooves 2104a' and the second positioning grooves 2104b'. The first tail portions 2324' and the second tail portions 2325' extend beyond the bottom surface 2102' and are exposed in the receiving groove 2100'. The mounting portions 232' are partially exposed in the receiving groove 2100' to increase the shielding length of the first signal terminal 221' and the second signal terminal 222'. When the metal shield surrounding members 23' are installed in place, the first barbs 2321a' and the second barbs 2322a' will pierce the inner wall of the terminal receiving grooves 2105' so as to improve the fixing force.

Secondly, the terminal modules 22' are inserted into the corresponding positioning grooves 2104' along a bottom-to-top direction. At this time, the ribs 2236' of the insulating blocks 223' press against the inner walls of the terminal receiving grooves 2105' so as to improve the installation reliability. When the terminal modules 22' are installed in place, top surfaces 2231a' of the insulating blocks 223' abut against bottom surfaces 2145a' of the partition 2145' in order to achieve position restriction. The first contact portions 221b' of the first signal terminals 221' and the second contact portions 222b' of the second signal terminals 222' respectively extend into the first terminal receiving holes 2143' and the second terminal receiving holes 2144'. The first mounting feet 221c' of the first signal terminals 221' and the second mounting feet 222c' of the second signal terminals 222' extend beyond the bottom surface 2102' and are exposed in the receiving groove 2100'.

Thirdly, the retaining portions 2326' are bent inwardly so that the retaining portions 2326' is located in the positioning grooves 2232c' and abut against the corresponding insulating blocks 223'. With this arrangement, on the one hand, the metal shield surrounding members 23' can be prevented from escaping upwardly from the insulating protrusions 214', and on the other hand, the terminal modules 22' can be prevented from being separated from the housing 21'.

Finally, the mounting block 24' is installed in the receiving groove 2100' along the bottom-to-top direction. At this time, the U-shaped mounting portions 232' are inserted into the openings 243' of the mounting block 24' under the guidance of the first bell mouth 2414c' and the second bell mouth 2414d'. At this time, the first bending portions 2321' abut against the first inner side surfaces 2411'. The second bending portions 2322' abut against the second inner side surfaces 2412'. The connecting portions 2320' abut against the fourth inner side surfaces 2414'. The first tail portions 2324' and the second tail portions 2325' of the metal shield surrounding members 23', the first mounting feet 221c' of the first signal terminals 221', and the second mounting feet 222c' of the second signal terminals 222' extend through the openings 243' of the mounting block 24' to be electrically connected to the second circuit board 302.

When the first backplane connector 100 is mated with the second backplane connector 200', the first housing 1 of the first backplane connector 100 is inserted into the receiving space 213' of the housing 21' of the second backplane connector 200'. The hollow portions 231' of the terminal modules 22' of the second backplane connector 200' are inserted into the first terminal modules 2 of the first backplane connector 100 under the guidance of the deflection portions 2315'.

The above embodiments are only used to illustrate the present disclosure and not to limit the technical solutions described in the present disclosure. The understanding of this specification should be based on those skilled in the art. Descriptions of directions, such as "front", "rear", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector, comprising:
    a housing comprising a base and a plurality of insulating protrusions integrally extending from the base, the insulating protrusions being spaced apart from each other, the base defining a plurality of terminal receiving grooves;
    a first side wall extending from one end of the base;
    a second side wall extending from the other end of the base;
    a plurality of terminal modules assembled to the housing, each terminal module comprising a first signal terminal, a second signal terminal and an insulating block fixed on the first signal terminal and the second signal terminal; the first signal terminal comprising a first fixing portion fixed to the insulating block and a first contact portion extending from the first fixing portion, the first contact portion having a two-half structure and comprising a first contact piece, a second contact piece and a first insertion hole located between the first contact piece and the second contact piece; the first insertion hole being configured to receive a first conductive terminal of a mating connector; the second signal terminal comprising a second fixing portion fixed to the insulating block and a second contact portion extending from the second fixing portion, the second contact portion having a two-half structure and comprising a third contact piece, a fourth contact piece and a second insertion hole located between the third contact piece and the fourth contact piece; the second insertion hole being configured to receive a second conductive terminal of the mating connector; the insulating block being received in a corresponding terminal receiving groove; and
    a plurality of metal shield surrounding members each of which is sleeved on a corresponding insulating protrusion;
    wherein the base, the first side wall and the second side wall jointly form a receiving space for at least partially receiving the mating connector; and
    wherein the insulating protrusions extend into the receiving space, the plurality of metal shield surrounding members are assembled to the insulating protrusions along a first direction, and the plurality of terminal modules are received in the insulating protrusions along a second direction opposite to the first direction.

2. The backplane connector according to claim 1, wherein the plurality of insulating protrusions are disposed in multiple rows, and the insulating protrusions in two adjacent rows are disposed in a staggered manner.

3. The backplane connector according to claim 1, wherein each insulating protrusion comprises a first terminal receiving hole to receive the first signal terminal and a second terminal receiving hole to receive the second signal terminal.

4. The backplane connector according to claim 3, wherein each insulating protrusion comprises an upper end surface and a communicating groove extending through the upper end surface; and wherein the first terminal receiving hole and the second terminal receiving hole are located at a bottom of the communicating groove and are in communication with the communicating groove.

5. The backplane connector according to claim 3, wherein the housing comprises a partition to separate the first terminal receiving hole and the second terminal receiving hole.

6. The backplane connector according to claim 4, wherein the communicating groove comprises a first arc-shaped groove corresponding to the first terminal receiving hole, a second arc-shaped groove corresponding to the second terminal receiving hole, and a straight slot communicating with the first arc-shaped groove and the second arc-shaped groove.

7. The backplane connector according to claim 6, wherein an arc of the first arc-shaped groove is a major arc, and a center of the major arc overlaps with a center of the first terminal receiving hole; and
wherein an arc of the second arc-shaped groove is a major arc, and a center of the major arc overlaps with a center of the second terminal receiving hole.

8. The backplane connector according to claim 6, wherein the terminal receiving groove is in communication with the first terminal receiving hole and the second terminal receiving hole; and a top surface of the insulating block abuts against a bottom surface of a partition of the base in order to achieve position restriction.

9. The backplane connector according to claim 1, wherein an end of the metal shield surrounding member comprises a deflection portion bent inwardly, and the deflection portion is adapted to guide insertion of the metal shield surrounding member into the mating connector.

10. The backplane connector according to claim 1, wherein the metal shield surrounding member comprises a hollow portion, a mounting portion extending downwardly from the hollow portion, and a plurality of mounting feet extending downwardly from the mounting portion; and wherein the base comprises a positioning groove extending through the mounting portion along a top-bottom direction for positioning the mounting portion.

11. The backplane connector according to claim 10, wherein the mounting portion comprises a retaining portion abutting against the terminal module, the retaining portion is adapted for restricting the terminal module from being separated downwardly from the housing.

12. The backplane connector according to claim 3, wherein each insulating protrusion comprises a top surface through which the first terminal receiving hole and the second terminal receiving hole extend; a top end of the first contact portion and a top end of the second contact portion do not extend beyond the top surface along the second direction.

13. The backplane connector according to claim 1, wherein the first contact piece and the second contact piece are separated by two first slots which extend through a top end of the first contact portion; and
wherein the third contact piece and the fourth contact piece are separated by two second slots which extend through a top end of the second contact portion.

14. A backplane connector, comprising:
a housing comprising a base and a plurality of insulating protrusions integrally extending from the base, the insulating protrusions being spaced apart from each other;
a first side wall extending from one end of the base;
a second side wall extending from the other end of the base;
a plurality of terminal modules assembled to the housing, each terminal module comprising a first signal terminal, a second signal terminal and an insulating block fixed on the first signal terminal and the second signal terminal; the first signal terminal comprising a first fixing portion fixed to the insulating block and a first contact portion extending from the first fixing portion, the first contact portion having a two-half structure and comprising a first contact piece, a second contact piece and a first insertion hole located between the first contact piece and the second contact piece; the first insertion hole being configured to receive a first conductive terminal of a mating connector; the second signal terminal comprising a second fixing portion fixed to the insulating block and a second contact portion extending from the second fixing portion, the second contact portion having a two-half structure and comprising a third contact piece, a fourth contact piece and a second insertion hole located between the third contact piece and the fourth contact piece; the second insertion hole being configured to receive a second conductive terminal of the mating connector; and
a plurality of metal shield surrounding members each of which comprises at least one tail portion configured to be fixed to a circuit board and a hollow portion being sleeved on a corresponding insulating protrusion, the hollow portion comprising a first side wall, a second side wall, a third side wall and a fourth side wall; the first side wall, the second side wall, the third side wall and the fourth side wall being connected in sequence; wherein the first side wall and the third side wail are disposed face to face; the second side wall and the fourth side wall are disposed face to face;
wherein the base, the first side wall and the second side wall jointly form a receiving space for at least partially receiving the mating connector; and
wherein the insulating protrusions extend into the receiving space, the plurality of metal shield surrounding members are assembled to the insulating protrusions along a first direction, and the plurality of terminal modules are received in the insulating protrusions along a second direction opposite to the first direction.

15. The backplane connector according to claim 14, wherein each insulating protrusion comprises a first terminal receiving hole to receive the first signal terminal and a second terminal receiving hole to receive the second signal terminal.

16. The backplane connector according to claim 15, wherein each insulating protrusion comprises an upper end surface and a communicating groove extending through the upper end surface; and wherein the first terminal receiving hole and the second terminal receiving hole are located at a bottom of the communicating groove and are in communication with the communicating groove.

17. The backplane connector according to claim 16, wherein the communicating groove comprises a first arc-shaped groove corresponding to the first terminal receiving hole, a second arc-shaped groove corresponding to the second terminal receiving hole, and a straight slot communicating with the first arc-shaped groove and the second arc-shaped groove.

18. The backplane connector according to claim 15, wherein each insulating protrusion comprises a top surface through which the first terminal receiving hole and the second terminal receiving hole extend; a top end of the first contact portion and a top end of the second contact portion do not extend beyond the top surface along the second direction.

19. The backplane connector according to claim 14, wherein the first contact piece and the second contact piece are separated by two first slots which extend through a top end of the first contact portion; and wherein the third contact piece and the fourth contact piece are separated by two second slots which extend through a top end of the second contact portion.

20. The backplane connector according to claim 14, wherein each metal shield comprises a retaining portion which is bent horizontally to abut against a corresponding insulating block of the terminal module; and the retaining portion is configured to prevent the terminal module from being separated downwardly from the housing.

\* \* \* \* \*